(12) United States Patent
Picard

(10) Patent No.: US 7,705,741 B2
(45) Date of Patent: Apr. 27, 2010

(54) DETECTION OF A BROKEN WIRE BETWEEN POWER SOURCING EQUIPMENT AND A POWERED DEVICE

(75) Inventor: Jean Picard, Hooksett, NH (US)

(73) Assignee: Texas Instruments Incorporated, Dallas, TX (US)

( * ) Notice: Subject to any disclaimer, the term of this patent is extended or adjusted under 35 U.S.C. 154(b) by 340 days.

(21) Appl. No.: 11/804,827

(22) Filed: May 21, 2007

(65) Prior Publication Data

US 2008/0291039 A1 Nov. 27, 2008

(51) Int. Cl.
G08B 21/00 (2006.01)
(52) U.S. Cl. .................. 340/652; 340/660; 340/664; 340/657; 375/257
(58) Field of Classification Search .................. 340/660, 340/664, 652, 657, 651, 538, 538.11, 538.17; 324/691, 713, 76.11; 375/257, 258; 713/300, 713/320
See application file for complete search history.

(56) References Cited

U.S. PATENT DOCUMENTS 7,474,704 B2 * 1/2009 Lum et al. ................... 375/257
7,511,515 B2 * 3/2009 Herbold ....................... 324/691

OTHER PUBLICATIONS

Silicon Laboratories, Inc., Si3400/01 Power Over Ethernet PD Controllers, 2007.
National Semiconductor Corporation, LM5071—Power Over Ethernet PD Controller With Auxiliary Power Interface, 2007.
eeProductCenter, Power-Over-Ethernet Controller Extends the IEEE Spec, Apr. 10, 2007.
ThomasNet Industrial NewsRoom, News Story—PoE Controller Suits High Powered Device Applications, Apr. 11, 2007.
National Semiconductor Corporation, Introduces Industry's First Single-Chip, Power Over Ethernet Device Controller Designed for Low-Voltage Auxillary Power Sources, Jan. 16, 2006.
Embedded Star (Online Destiny Ltd.), TI Introduces New Controller IC and Plug-In Power Module, May 18, 2004.
Texas Instruments Incorporated; IEEE 802.3af Power Interface Switch for Power Over Ethernet (PoE) Powered Devices, Aug. 2002—revised Mar. 2004.
Texas Instruments Incorporated, Reference Design, TPS23750 High Efficiency 5V at 2.2A PoE PD, SLVU159—Feb. 2007.
Power Electronics Technology, David Morrison, Power Over Ethernet Nurtures a New Class of Controller Chips, May 1, 2004.

* cited by examiner

*Primary Examiner*—Anh V La
(74) *Attorney, Agent, or Firm*—William B. Kempler; Wade J. Brady, III; Frederick J. Telecky, Jr.

(57) ABSTRACT

A system and method for detecting a broken wire in a communication cable coupling a powered device to power sourcing equipment. Powered Devices (PDs) may be powered by power sourcing equipment via communication cables as in power over Ethernet systems. A current share technique is employed at the Power Sourcing Equipment (PSE) side or the PD side of the Ethernet cable to force currents in twisted pairs of the communication cable to be equal. In one embodiment, first and second power supplies within a PSE are coupled to first and second powered device controllers (PDCs). A characteristic within the system that is indicative of first and second PDC input voltages is measured and the two measured characteristics are compared. If the two measured characteristics are not substantially the same, such indicates the presence of a broken wire. In another embodiment, a broken wire is detectable as an imbalance in voltage drops across resistors disposed in series with wires of a twisted pair at either the PSE or PD end of the twisted pair.

18 Claims, 3 Drawing Sheets

DETECTION OF A BROKEN WIRE BETWEEN POWER SOURCING EQUIPMENT AND A POWERED DEVICE

CROSS REFERENCE TO RELATED APPLICATIONS

Not Applicable

STATEMENT REGARDING FEDERALLY SPONSORED RESEARCH OR DEVELOPMENT

Not Applicable

BACKGROUND OF THE INVENTION

The present invention relates to the supply of power over signaling wires used for data communication and more specifically, to the detection of a broken wire in a data communication system, such as a Power over Ethernet (PoE) system.

PoE is becoming increasingly common for a number of reasons. When signal wires are provided that permit communication from a data sourcing device to a remote device, by providing power to the remote device over the signal wires, one need not couple the remote device to another source of power. This can avoid the need to include a power supply in a Powered Device (PD) that is powered from an AC power source and additionally, minimizes cabling which can be costly. Moreover, the addition of a power supply to remote devices that are communicably coupled to a communication system via an Ethernet cable can add significant cost, weight and size to such a remote device. By using a PoE system, the disadvantages of self-powered remote devices are avoided.

When powering remote devices in a PoE system, there is a need to be able to detect broken wires in power feeds. Absent the ability to detect a broken wire in such a system, cables may overheat. The overheating of cables can pose a risk of fire and can result in permanent degradation of the cable.

For the above reasons it would be desirable to have a reliable and inexpensive system and method for detecting a broken wire in a PoE system.

BRIEF SUMMARY OF THE INVENTION

In accordance with the present invention, a system and method for detecting broken wires in a PoE system are disclosed. A PoE system includes Power Sourcing Equipment (PSE), a Powered Device (PD) and a signaling cable, such as an Ethernet cable, disposed between and electrically coupling the PSE to the PD. The signaling cable may be configured to provide both data signaling and power over the same communication cable. The communication cable typically includes a plurality of 2 wire twisted pairs.

In one embodiment, forward and return currents are coupled from a first power supply in the PSE to inputs of a first Powered Device Controller (PDC) within the powered device. PDCs are well known and serve to verify the characteristics of the load before the application of power from the PSE to the load. The outputs of the PDC may be connected directly to the load or alternatively, to a DC to DC converters which powers the load. A current share technique is employed at the Power Sourcing Equipment (PSE) or the Powered Device (PD) to force currents in associated pairs of the Ethernet cable to be equal.

In the normal state in which no wires of a twisted pair are broken, the forward current is carried within 2 wires of a first twisted pair and the return current is carried within 2 wires of a second twisted pair. Additionally, forward and return currents are coupled from a second power supply in the PSE to inputs of a second PDC within the powered device. In the normal state, the forward current and return currents are each carried over 2 wires of a twisted pair; i.e. the forward and return currents associated with the first power supply are carried over first and second twisted pairs respectively and the forward and return currents associated with the second power supply are carried over third and fourth twisted pairs, respectively.

Signals are generated that are indicative of the voltages across the inputs of the first and second PDCs. These signals may be generated based on direct measurements of the inputs to the PDCs or based on measurements of voltages, currents or duty cycles within the PD that are reflective of the voltage at the inputs to the PDCs. In the normal state in which none of the wires within the four twisted pairs are broken, the signals indicative of the input voltages to the first and second PDCs are substantially the same. In the event one wire of a twisted pair is broken, the resistance of the parallel combination of the two wires within the twisted pair is twice what it would be if one of the wires was not broken. A broken wire in a twisted pair thus produces a reduction in the input voltage at the affected PDC. The broken wire may be detected by comparing the signals indicative of the input voltages to the two PDCs. If, the comparison indicates that the signals are not substantially the same, one of the wires within the twisted pairs is broken. Upon detection of a broken wire, a signal may be generated that indicates the presence of a broken wire and conveyed to the PSE by the PD.

In another embodiment, a first terminal of a power supply within a PSE is coupled to a first end of first and second resistors. Each of said resistors has the same resistance. The second end of each of the resistors is coupled to one of the wires of a first twisted pair through respective first and second inductors to form first and second series resistor-inductor-wire paths. The other end of the wires of the first twisted pair are each coupled to opposing ends of a center tapped inductor at the PD end of the respective twisted pair. The center tap is coupled to a rectifier bridge. A second terminal of the power supply is coupled to a first end of third and fourth resistors. The third and fourth resistors have the same-resistance. The second end of each of the third and fourth resistors is coupled to one of the wires of a second twisted pair through respective third and fourth inductors to form first and second series resistor-inductor-wire paths. The end of the wires of the second twisted pair are each coupled to opposing ends of a center tapped inductor at the PD end of the respective twisted pair. The center tap is coupled to the rectifier bridge. Since the first and second twisted pairs carry forward and return currents, the forward and return currents through the first and second twisted pairs are the same.

A first voltage is measured between the second ends of the first and second resistors at the PSE. In the event the first voltage is not substantially zero, i.e. the measured voltage is above or below a specified value, a signal is generated indicating that one wire of the first twisted pair is broken.

Similarly, a second voltage is measured between the second ends of the third and fourth resistors at the PSE. In the event the second voltage is not substantially zero, i.e. the measured voltage is above or below a specified value, a signal is generated indicating that one wire of the second twisted pair is broken.

Other features, functions and aspects of the invention will be apparent to those of ordinary skill in the art from the Detailed Description of the Invention that follows.

BRIEF DESCRIPTION OF THE SEVERAL VIEWS OF THE DRAWINGS

The invention will be more fully understood by reference to the following Detailed Description of the Invention taken in conjunction with the drawings of which.

DETAILED DESCRIPTION OF THE INVENTION

In accordance with the present invention a system and method for detecting a broken wire of a communication cable is disclosed. More specifically, in a system in which a powered device (PD) is powered by power sourcing equipment (PSE) over a communication cable the disclosed system and method provide a mechanism for identifying a broken wire in the communication cable coupling the PSE to the PD.

Figure 1:
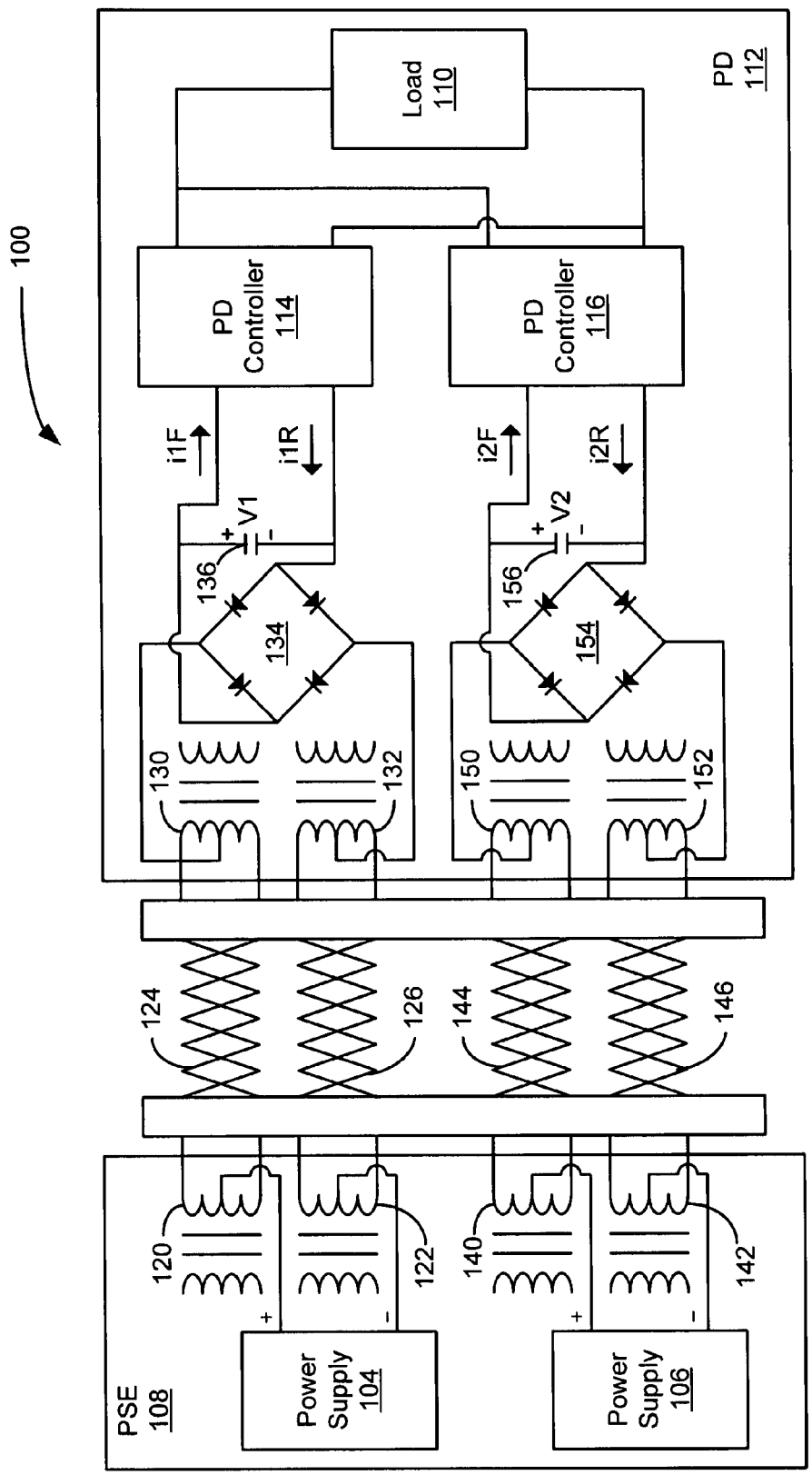
FIG. 1 is a block diagram of a first embodiment of a PoE system that permits the detection of a broken wire of a communications cable within the system.

Referring to FIG. 1, in a system 100, first and second power supplies 104, 106 within a PSE 108 provide power to a load at a PD 112. The PD 112 includes first and second Powered Device Controllers (PDCs) 114, 116 that receive power from the first and second power supplies 104, 106 respectively. PDCs are well known in the art and support functions of detection of the resistance range of a load in a PD to identify Ethernet devices that are not intended for the application of 48 Volts. Additionally, PDCs optionally support classification of a PD to determine the PD power requirements and allot only as much power as is necessary. Finally, the PSE controls the application of power to the PD following detection and classification operations. The PDCs may comprise IEEE 802.3af compatible PoE Powered Device Controllers such as TPS2375, 2376, 2377 commercially available from Texas Instruments, Inc., Dallas, Tex. and which are described in a data sheet titled IEEE 802.3af PoE Powered Device Controllers, dated April 2004, which data sheet is incorporated herein by reference. Any other suitable PDC may also be used. The PDCs 114, 116 are coupled to a DC to DC converter within the PD 112 or any other common load 110. The presently described functionality for broken wire detection may be incorporated into a PDC or implemented in circuitry external to the PDC.

The positive and negative outputs of the power supply 104 are coupled to center-taps of first and second center tapped inductors 120, 122. The ends of the inductors 120, 122 are coupled to the wires of respective twisted pairs 124, 126. The wires of the twisted pairs 124, 126 are coupled to ends of respective center-tapped inductors 130, 132 at the PD 112 end of the respective twisted pair. The center-taps of the inductors 130, 132 are coupled to a rectifier bridge 134. The rectifier bridge 134 is provided to make the PD 112 insensitive to the polarity of the power supply 104 connection. The positive and negative outputs of the rectifier bridge 134 are coupled to ends of a filter capacitor 136 and to the inputs of the first PDC 114.

Similarly, the positive and negative outputs of the power supply 106 are coupled to center-taps of first and second center tapped inductors 140, 142. The ends of the inductors 140, 142 are coupled to the wires of respective twisted pairs 144, 146. The wires of the twisted pairs 144, 146 are coupled to ends of respective center-tapped inductors 150, 152 at the PD 112 end of the respective twisted pairs. The center-taps of the inductors 150, 152 are coupled to a rectifier bridge 154. The rectifier bridge 154 is provided to make the PD 112 insensitive to the polarity of the power supply 106 connection. The positive and negative outputs of the rectifier bridge 154 are coupled to ends of a filter capacitor 156 and to the inputs of the second PDC 116.

In a PoE system employing two power supplies, current sharing is desirable to assure that each power supply provides half of the current required by the load. When current sharing is employed, the currents i1F=i2F=i1R=i2R. Current sharing is achieved by monitoring and controlling PDC input currents, output currents or the duty cycle within the respective PDCs, either directly or indirectly to obtain substantially equal current sourcing from the power supplies 104, 106 and from the PDCs 114, 116 to the common load 110.

The resistance of the wire in a PoE system can be significant. In particular, CAT 5e cable employs 24 gauge wire having a resistance of approximately 0.084 ohms per meter. The IEEE 802.3af specification states that the worst case round trip resistance is 12.5 ohms for forward and return paths in series assuming 2 wires of twisted pair are in parallel in the forward and return paths respectively. It should be appreciated that for other communication cables having other gauges of wire, the worst case round trip resistance may differ.

If one of the wires in a twisted pair is broken, all of the forward or return current for the respective PSE is carried in the unbroken wire of the twisted pair. As a consequence, the voltage drop from end to end of a twisted pair that includes a broken wire will be twice as great as the end to end voltage drop across a twisted pair includes two intact or unbroken wires. Thus, a broken wire in any one of the twisted pairs 124, 126, 144, 146 will create an imbalance between the voltages V1 and V2. More specifically, a broken wire in a twisted pair will reduce the input voltage to the PDC that includes the broken wire in the forward or return current path.

In the illustrated embodiment, the input voltages V1 and V2 to the PDCs 114, 116 are monitored either directly or indirectly. If the voltages are substantially the same, such indicates that no single wire within the twisted pairs 124, 126, 144 and 146 is broken.

Monitoring of the input voltages to the PDCs may be performed directly, by measuring the voltage at the inputs to the PDCs 114, 116 or indirectly, by measuring another characteristic, such as a voltage, a current, or a duty cycle or a time duration within the PDC or the PD that is reflective of the input voltage to the respective PDC. Whether directly monitoring or indirectly monitoring the input voltages to the PDCs, the monitored characteristics associated with the respective PDCs are compared. If the monitored characteristics are substantially the same, such indicates that no wires within the twisted pairs are broken. Alternatively, if the monitored characteristics differ by a predefined value, such is indicative of the presence of a broken wire in one of the twisted pairs.

For example if a buck power supply is provided at the PD end of the twisted pair, the steady state duty cycle is inversely proportional to the input voltage of the PD. More specifically if the input voltage to the PD is doubled, the duty cycle will be approximately one half of the prior duty cycle. Thus, knowing the duty cycle one can determine the input voltage to the PD.

Similarly, a time duration of a duty cycle of switching power supply of a fixed period may be measured to provide an indication of the input voltage to the PD.

Based on the topology of the power supply, it will be appreciated by those of ordinary skill that an average voltage, an average currents, a peak voltage or a peak current may be measured to provide a direct or indirect indication of the input voltage to the PD based on the location of the measurement.

The detection of a broken wire is more readily achieved for long cables than short cables since, for short cables, there is a smaller difference in the resistance of the twisted pair that contains a broken wire.

As is known in the art, typical CAT 5 Ethernet cables include twisted pairs employing 24 gauge wire with a resistance of approximately 0.084 ohms per meter for copper wire. Thus, in a system utilizing a CAT 5 communication cable 100 meters in length, the difference between the inputs voltages at the at the PDCs 114, 116 in a system in which one of the wires in a twisted pair is broken would be approximately equal to the current supplied by the power supplies (i)*(0.042 ohms)/meter.

Upon detection of a broken wire in a PD a signal may be generated that provides an indication of the presence of a broken wire using signaling techniques well known in the art. The indication of the broken wire may be conveyed from the PD to the PSE without allowing power to be applied to the load within the PD.

Figure 2:
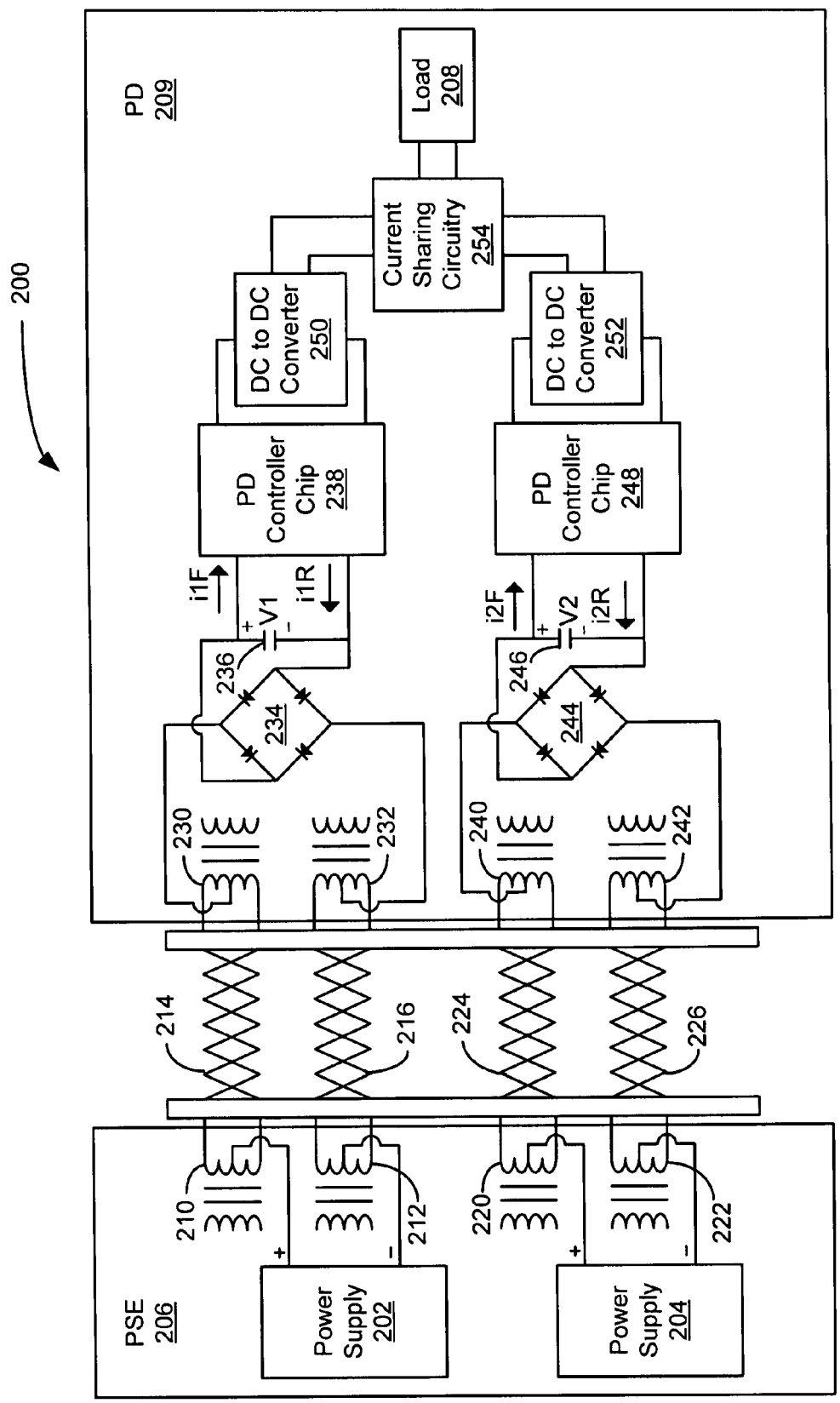
FIG. 2 is a block diagram of a second embodiment of a PoE system that permits the detection of a broken wire of a communications within the system.

FIG. 2 depicts a PoE 200 system in which two power supplies 202, 204 within PSE 206 provide power for a load 208 within a PD 209 over twisted pairs 214, 216, 224 and 226. More specifically, the positive and negative outputs of the power supply 202 are coupled to the center taps of center tapped inductors 210, 212 respectively. The ends of the center tapped inductors 210, 212 are in turn coupled to the wires of twisted pairs 214, 216 respectively. Similarly, the positive and negative outputs of the power supply 204 are coupled to the center taps of center tapped inductors 220, 222. The ends of the center tapped inductors 220, 222 are coupled to the wires of twisted pairs 224, 226 respectively.

At the PD end of the twisted pairs 214, 216, the twisted pairs 214, 216 are coupled to the ends of center tapped inductors 230, 232 respectively. The center taps of the inductors 230, 232 are coupled to the inputs of a rectifier bridge 234. The positive output of the rectifier bridge 234 is coupled to the positive side of a filter capacitor 236 and to the positive input of a first PDC 238. The negative output of the rectifier bridge 234 is coupled to the negative side of the filter capacitor 236 and to the negative input of the first PDC 238.

Also at the PD end of twisted pairs 224, 226, the twisted pairs 224, 226 are coupled to the ends of center tapped inductors 240, 242 respectively. The center taps of the inductors 240, 242 are coupled to the inputs of a rectifier bridge 244. The positive output of the rectifier bridge 244 is coupled to the positive side of a filter capacitor 246 and to the positive input of a second PDC 248. The negative output of the rectifier bridge 244 is coupled to the negative side of the filter capacitor 246 and to the negative input of the second PDC 248.

In the second illustrated embodiment, the PD control chips 238, 248 power DC to DC converters 250, 252 respectively, which in turn, power the load 208 via current sharing control logic 254 which forces the currents $i1F=i1R=i2F=i2R$. The current sharing control logic 254 assures that the current supplied through the twisted pairs is substantially equal and that the current supplied to the load 208 through respective DC to DC converters 250, 252 is substantially equal. It should be appreciated that there are many ways known in the art to assure current sharing. The Current Sharing Circuitry 254 assures that the current supplied by each supply 250, 252 is substantially the same. It should be further appreciated that the current sharing need not provide equal currents from each converter 250, 252

In normal operation, without any broken wires in the twisted pairs 214, 216, 224, 226, the currents $i1F$, $i1R$, $i2F$ and $i2R$ are all substantially equal. Thus, the voltage drops though the twisted pairs are substantially equal and the voltages V1 and V2 are substantially equal.

In the event that one wire of the twisted pairs 214, 216, 224, 226 is broken, the input voltage V1 to the first PDC 238 will differ from the input voltage V2 to the second PDC 248 since the resistance of a single wire of a twisted pair is approximately twice the resistance of two wires of a twisted pair connected in parallel. The difference between the voltages V1 and V2 resulting from the imbalance produced by a broken wire in one of the twisted pairs can be measured directly or indirectly as discussed above in connection with FIG. 1 to identify the presence of a broken wire.

Upon determining that the voltage V1 differs from the voltage V2 by at least a specified value, a signal may be generated to indicate that a broken wire exists in one of the twisted pairs.

Figure 3:
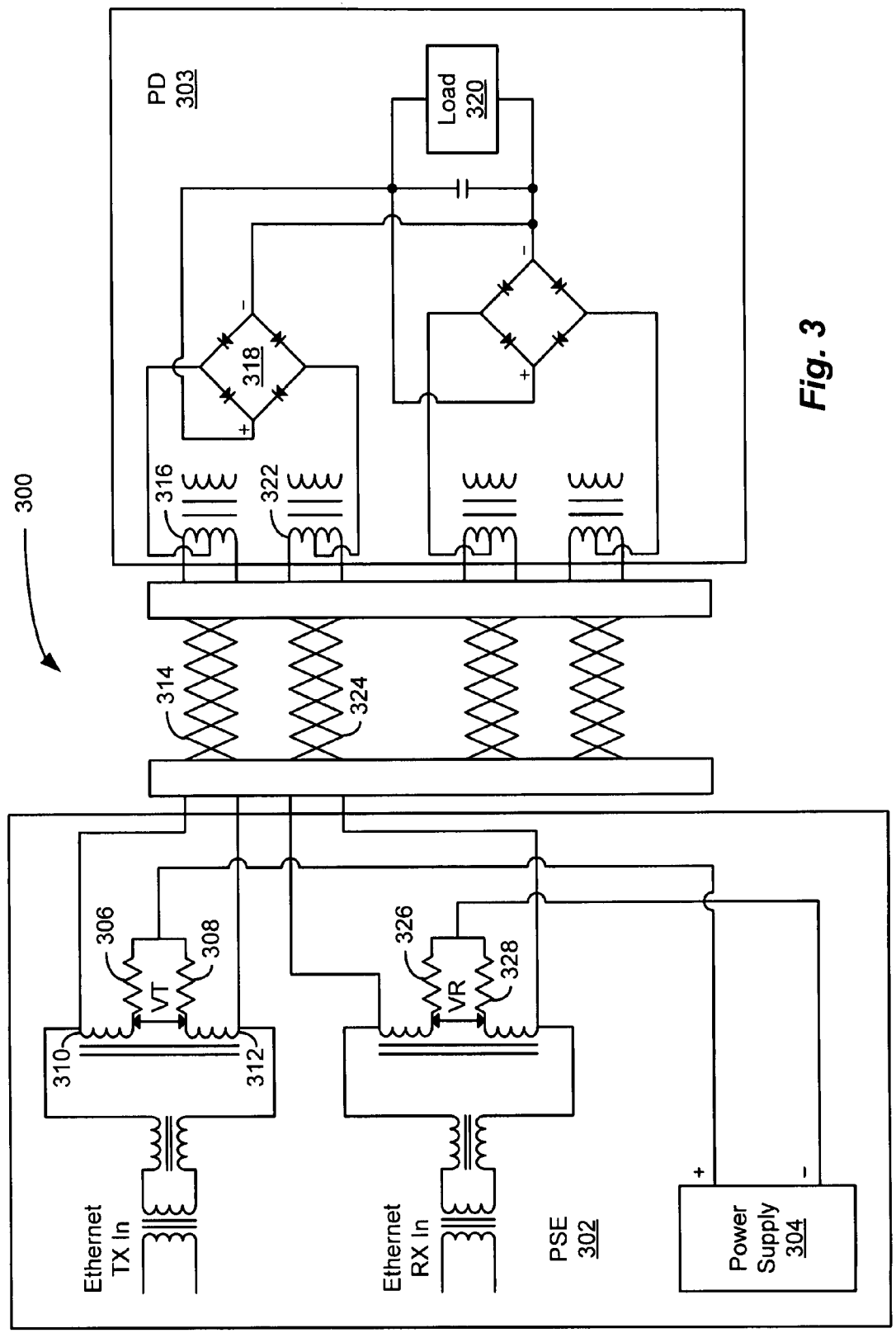
FIG. 3 is a block diagram of a third embodiment of a PoE system that permits the detection of a broken wire of a communications cable within the system.

FIG. 3 depicts another embodiment for detecting a broken wire in a PoE system 300 in which a PD 303 is powered by PSE 302. Referring to FIG. 3, the PSE 302 includes a power supply 304 having positive and negative outputs. The positive output of the power supply 304 is coupled to a first end of first and second low value resistors 306, 308. In one embodiment, the resistors typically have a resistance of less than 10 ohms although the specific value is selected to achieve desired voltage drop while avoiding undesired power loss. The values of the resistors 306, 308 in one embodiment are substantially the same. The second end of each of the resistors 306, 308 is coupled to a first end of inductors 310, 312 respectively. The second end of each of the inductors 310, 312 is conductively coupled to one wire of a twisted pair 314, such as a CAT 5, 5e, or a similar communication cable. Thus, assuming both wires of the twisted pair 314 are intact, the current from the positive output of the power supply 304 is divided and is substantially equal through the series paths through resistor 306, the inductor 310 and one wire of twisted pair 314 and through resistor 308, the inductor 312 and the other wire of the twisted pair 314. Since the currents through resistors 306, 308 are substantially the same when both wires of the twisted pair 314 are intact, the voltage drop across the resistor 306 equals the voltage drop across resistor 308 when neither wire of the twisted pair 314 is broken. Consequently, when both wires of the twisted pair 314 are intact, the voltage VT between the second ends of the resistors 306, 308 is approximately zero (0) volts when the resistance values are the same.

In the event one of the wires of the twisted pair 314 is broken, all of the current sourced by the power supply 304 flows through the non-broken wire and the associated resistor, i.e. either resistor 306 or 308. As a consequence, there is a voltage drop across one of the resistors (306 or 308) that is in series with the non-broken wire of the twisted pair 314 but there is no voltage drop across the other one of the resistors (306 or 308) that is in series with the broken wire since no current flows through that resistor. Thus, the voltage VT measured between the second ends of the resistors 306, 308 is non-zero. The polarity of the voltage provides an indication of which wire within the twisted pair is broken. A non-zero voltage VT above or below a specified value indicates the presence of a broken wire within the communication cable and more specifically, the twisted pair 314. The polarity of the voltage indicates the particular wire within the twisted pair that is broken. Upon detection of a broken wire in the PSE 302, the PSE 302 may generate a signal indicative of the detection of the broken wire and prevent the application of power to the load 320.

The current sourced by the power supply 304, after passing through the twisted pair 314, feeds the ends of a center-tapped inductor 316. The center tap of the inductor 316 is coupled to a rectifier bridge 318. The rectified output of the rectifier bridge 318 powers a load 320.

A return current path is provided from the rectifier bridge 318 to a center tap of an inductor 322. Opposing ends of the inductor 322 are coupled to a twisted pair 324 which carries the return current from the PD end of the communication cable to the PSE 302. The negative output of the power supply 304 is coupled to first ends of resistors 326, 328. The resistance of the resistors 326, 328 is selected to achieve a measurable voltage drop or current without undue power loss and is typically less than 10 ohms. The resistors 326, 328 may have substantially the same value. It should be understood that any suitable resistance value may be employed. Since the resistance of each one of the wires in a twisted pair, for any given length, is approximately the same, and since the series connected resistors 326, 328 are of the same resistance, the resistance of each series path that includes a resistor, an inductor and a length of wire in the twisted pair in the parallel return paths is approximately the same when the wires are intact. Consequently, the current that flows through each leg is approximately the same when both wires of the twisted pair 324 are intact. The second end of each one of the resistors 326, 328 is coupled to one of the wires of the twisted pair 324. Thus, if both of the wires in the twisted pair 324 are intact, the current through each of the wires and the associated series connected resistor 326, 328 is approximately the same and the voltage drop across each one of the resistors 326, 328 is approximately the same as discussed above with respect to resistors 306, 308. The voltage between the second ends of the resistors 326, 328 (VR) is therefore approximately equal to zero when both wires of the twisted pair 324 are intact.

As discussed above in connection with the forward path through twisted pair 314, in the event that one of the wires in the twisted pair 324 is broken, the current flow through the resistors 326 and 328 will not be balanced and the voltage VR will be non-zero. The polarity of the voltage VR indicates which one of the wires within the twisted pair 324 is broken. The measurement of a voltage VR that is above or below a specified value indicates that one of the wires within the twisted pair 324 is broken. Upon detection of a broken wire within the twisted pair 324, the PSE 302 may generate a signal that indicates that a wire within the twisted pair 324 is broken. The signal may also identify which one of the wires is broken based on the polarity of the measured signal.

While FIG. 3 illustrates the use of resistors 306, 308, 326, 328 at the PSE, it should be appreciated that the resistors 306, 308, 326, 328 that are shown at the PSE 302 ends of the twisted pairs 314, 324 may be disposed at the PD 303 end of the twisted pairs 314, 324, in which case, the measurement of the voltage VT and VR would be made within the PD rather than the PSE. Alternatively, if currents are being measured through the respective resistors, such measurements would be performed at the PD.

Additionally, while the illustrated embodiment depicts first and second electrically conductive paths wherein each path includes first and second legs and each leg include a resistor at one end of the leg, an inductive winding and one wire of a respective twisted pair, other embodiments are contemplated. For example, the end of each leg may terminate in an inductive winding and the resistors may be disposed in series intermediate the respective inductive winding and the respective wire of the twisted pair.

Moreover, while in one embodiment, the resistors in each leg of the respective conductive path have resistance values that are substantially the same, it should be appreciated that the resistance values may be different. In the case where the resistance values in different legs of the same conductive path are different, the voltage between the second ends of the resistors will not be zero when the two legs are sharing the current equally. In this circumstance, the voltage between the second ends of the resistors will be a predetermined non-zero value and a broken wire is indicated if the voltage between the second ends of the resistors differs from the predetermined non-zero value by at least a predetermined magnitude.

Furthermore, while the embodiment illustrated in FIG. 3 is explained in terms of the measurement of a voltage between the second ends of the resistors, e.g. resistors 306, 308 or 326, 328, alternatively, the current through each leg may be separately measured and the currents may be compared to determine whether the current is substantially equal in the respective legs of a conductive path including two generally parallel legs. In the event the current is not substantially equal in the two legs of a conductive path, such is indicative of a broken wire.

Finally, in the embodiment of FIG. 3, it should be appreciated that the series resistors disposed in the legs of the conductive paths may be located at either the PSE end or the PD end of the twisted pair and detection of a broken may be performed at the PSE end of the PD end of the twisted pair, respectively.

It will be appreciated by those of ordinary skill in the art that modifications to and variations of the above-described embodiments may be made without departing from the inventive concepts disclosed herein. Accordingly, the invention should not be viewed as limited except by the scope and spirit of the appended claims.

What is claimed is:

1. A method for detecting a broken wire in a system including a first power supply coupled to inputs of a corresponding first powered device controller via first and second twisted pairs and having a second power supply coupled to inputs of a corresponding second powered device controller via third and fourth twisted pairs, wherein the wires of each of the first and third twisted pairs are connected and configured to share forward currents from the respective power sourcing equipment to a corresponding powered device substantially equally when such wires are intact and wherein the wires of each of the second and fourth twisted pairs are connected and configured to share return currents from the respective powered device to the corresponding power supplies substantially equally when such wires are intact, the method comprising:
   generating a first signal indicating whether the voltages across the inputs of the first and second powered device controllers is substantially the same; and
   in the event the voltages across the inputs to the first and second powered device controllers are not substantially the same, generating a second signal indicating that one of said twisted pairs includes a broken wire.

2. The method of claim 1 wherein the generating step includes the step of measuring the voltages across the inputs of said first and second powered device controllers.

3. The method of claim 1 wherein the generating step includes the steps of:
   generating an indication of a measurable characteristic in each of said first and second powered device controllers, wherein the measurable characteristic is representative of the input voltage of the respective powered device controller; and
   comparing the measurable characteristic in said first powered device controller to the measurable characteristic in said second powered device controller.

4. The method of claim 3 wherein the measurable characteristic in each of the first and second powered device controllers is a voltage measurement that is representative of the voltage at the input to the respective powered device controller.

5. The method of claim 3 wherein the measurable characteristic in each of the first and second powered device controllers is a current that is representative of the voltage at the input to the respective powered device controller.

6. The method of claim 3 wherein the measurable characteristic in each of the first and second powered device controllers is a duty cycle that is representative of the voltage at the input to the respective powered device controller.

7. The method of claim 3 wherein the measurable characteristic in each of the first and second powered device controllers is a time duration that is representative of the voltage at the input to the respective powered device controller.

8. A method of detecting a broken wire in a system including power sourcing equipment having at least one power supply having a first and second outputs and a powered device controller having first and second inputs, said method comprising the steps of:
conductively coupling said first powered device controller input to said first power supply output via a first electrically conductive path, said first electrically conductive path including first and second parallel conductive legs extending between said first and second ends, said first conductive leg including a first resistor, a first inductive winding and a first wire of a first twisted pair, wherein said first resistor, said first inductive winding and a first wire of said first twisted pair are connected in series, said second conductive leg including a second resistor, a second inductive winding and a second wire of said first twisted pair, wherein said second resistor, said second inductive winding and the second wire of said first twisted pair are connected in series, wherein said first and second resistors have respective first and second resistance values;
coupling one of said first and second ends of said first electrically conductive path to said first power supply output and coupling the other one of said first and second ends of said first electrically conductive path to said first powered device controller input;
applying power to said first powered device controller input from said at least one power supply through said first electrically conductive path;
measuring at least one first circuit characteristic indicative of the sharing of current between the first and second legs of said first electrically conductive path; and
generating a first signal that indicates the presence of a broken wire if the at least one first circuit characteristic indicates that said first and second legs of said first electrically conductive path are not carrying substantially equal currents.

9. The method of claim 8 further including the steps of:
conductively coupling said second powered device controller input to said second power supply output via a second electrically conductive path, said second electrically conductive path including third and fourth parallel conductive legs extending between said first and second ends, said third conductive leg including a third resistor, a third inductive winding and a first wire of a second twisted pair, wherein said third resistor, said third inductive winding and a first wire of said second twisted pair are connected in series, said fourth conductive leg including a fourth resistor, a fourth inductive winding and a second wire of said second twisted pair, wherein said fourth resistor, said fourth inductive winding and the second wire of said second twisted pair are connected in series, wherein said third and fourth resistors have respective third and fourth resistance values;
coupling one of said first and second ends of said second electrically conductive path to said second power supply output and coupling the other one of said first and second ends of said second electrically conductive path to said second powered device controller input;
measuring at least one second circuit characteristic indicative of the sharing of current between the first and second legs of said second electrically conductive path; and
generating a second signal that indicates the presence of a broken wire if the at least one second circuit characteristic indicates that said first and second legs of said second electrically conductive path are not carrying substantially equal currents.

10. The method of claim 8 wherein the resistance values of said first and second resistors are substantially the same.

11. The method of claim 10 wherein said first and second resistors have first and second ends and said first end of each of said first and second resistors is coupled to one end of said first electrically conductive path.

12. The method of claim 8 wherein said first and second inductive windings each have first and second ends and said first end of each of said first and second inductive windings is coupled to one end of said first electrically conductive path.

13. The method of claim 8 wherein said first and second resistors have first and second ends and said first end of each of said first and second resistors is coupled to one end of said first electrically conductive path, and wherein said step of measuring said at least one first circuit characteristic indicative of the sharing of current between the first and second legs of said second electrically conductive path includes the step of measuring a first voltage between the second ends of the first and second resistors, and
said first signal generating step includes the step of generating a signal that indicates the presence of a broken wire if the first voltage differs from a first predetermined voltage value by at least a first predetermined magnitude.

14. The method of claim 13 wherein the resistance of the first and second resistors is substantially the same and said generating step comprises the step of generating a signal that indicates the presence of a broken wire if the first voltage differs from zero by at least said first predetermined magnitude.

15. The method of claim 13 further including the steps of:
generating a first signal indicating that said first wire of the first twisted pair is broken if the first voltage differs from said first predetermined voltage by at least said first specified magnitude and is of a first polarity; and
generating a second signal indicating that a second wire of the first twisted pair is broken if the first voltage differs from said first predetermined voltage by at least said first specified magnitude and is of a second polarity different from said first polarity.

16. The method of claim 8 wherein said step of measuring at least one first circuit characteristic indicative of the sharing of current between the first and second legs of said first electrically conductive path includes the step of measuring first and second currents through said first and second resistors and said first signal generating step includes the step of generating a signal that indicates the presence of a broken wire if the first and currents differ by at least a predetermined magnitude.

17. A method of detecting a broken wire in a system having power sourcing equipment providing a forward current to a powered device over a first twisted pair having first and second wires and receiving a return current from said powered device over a second twisted pair having first and second wires, wherein said first and second wires of said first twisted pair are connected in parallel and said first and second wires of said second twisted pair are connected in parallel, wherein said system includes first and second resistors having first and second ends, wherein said first and second resistors have the same resistance value, wherein said first end of each of said resistors are coupled to one another and to either said power sourcing equipment or said powered device, wherein said second end of one of said resistors is coupled to the first wire of one of said first and second twisted pairs and the second end of the other one of said resistors is coupled to the second wire of said one of said first and second twisted pairs, said method comprising the steps of:

detecting an indication of an imbalance in the currents in the first and second wires of either said first twisted pair or said second twisted pair;

in response to the detection of an imbalance in the currents in the wires of at least one of the said first or second twisted pairs, generating a signal indicative of a broken wire, and said step of detecting an indication of an imbalance in the currents in said first and second wires comprises the step of:

measuring the voltage between the second ends of said first and second resistors; and generating said signal in the event said measured voltage differs from zero by at least a predetermined value.

18. A method of detecting a broken wire in a system having power sourcing equipment providing a forward current to a powered device over a first twisted pair having first and second wires and receiving a return current from said powered device over a second twisted pair having first and second wires, wherein said first and second wires of said first twisted pair are connected in parallel and said first and second wires of said second twisted pair are connected in parallel, wherein said system includes first and second resistors having first and second ends, wherein said first and second resistors have the same resistance value, said first ends of each of said resistors are coupled to one another and to either said power sourcing equipment or said powered device, wherein said second end of one of said resistors is coupled to the first wire of one of said first and second twisted pairs and the second end of the other one of said resistors is coupled to the second wire of said one of said first and second twisted pairs, said method comprising the steps of:

detecting an indication of an imbalance in the currents in the first and second wires of either said first twisted pair or said second twisted pair;

in response to the detection of an imbalance in the currents in the wires of at least one of the said first or second twisted pairs, generating a signal indicative of a broken wire, and said step of detecting an indication of an imbalance in the currents in said first and second wires comprises the step of:

measuring first and second current through respective first and second resistors; and generating said signal in the event said first and second current differ from one another by at least a predetermined magnitude.

* * * * *